United States Patent [19]

Otani

[11] Patent Number: 5,656,776
[45] Date of Patent: Aug. 12, 1997

[54] SEMICONDUCTOR SENSOR WITH SEALED PACKAGE

[75] Inventor: Hiroshi Otani, Itami, Japan

[73] Assignee: Mitsubishi Denki Kabushiki Kaisha, Tokyo, Japan

[21] Appl. No.: 541,301

[22] Filed: Oct. 10, 1995

[30] Foreign Application Priority Data

May 12, 1995 [JP] Japan .................................. 7-114542

[51] Int. Cl.[6] .................................................. G01P 15/08
[52] U.S. Cl. ............................ 73/493; 73/514.01; 73/756
[58] Field of Search ........................ 73/493, 431, 514.01, 73/514.12, 514.13, 514.32, 514.33, 756, 654, 866.5; 338/2, 5

[56] References Cited

U.S. PATENT DOCUMENTS

| | | | |
|---|---|---|---|
| 4,499,773 | 2/1985 | Crampton et al. | 73/756 |
| 4,898,031 | 2/1990 | Oikawa et al. | 73/504.12 |
| 5,233,871 | 8/1993 | Schwarz et al. | 73/493 |
| 5,349,234 | 9/1994 | DesJardin et al. | 257/684 |

*Primary Examiner*—John E. Chapman
*Attorney, Agent, or Firm*—Leydig, Voit & Mayer

[57] ABSTRACT

A semiconductor sensor in a sealed cap package includes a sensing device for transducing a physical quantity into an electrical signal, a stem on which the sensing device is mounted, the stem including through holes in which electrically conducting leads are respectively mounted with electrically insulating sealing members, a cap covering the sensing device and mounted on the stem, and at least one rod extending from a back surface of the stem parallel to the leads for securing the semiconductor sensor to a mount.

6 Claims, 4 Drawing Sheets

SEMICONDUCTOR SENSOR WITH SEALED PACKAGE

BACKGROUND OF THE INVENTION

1. Field of the Invention

The present invention relates to a semiconductor sensor, such as a pressure sensor, acceleration sensor or the like, which utilizes a semiconductor element as a sensing means and, more particularly, to a sealed package with a cap (also known as a hermetically sealed package) structure for a semiconductor sensor.

2. Description of the Prior Art

FIG. 7 is a front view of a semiconductor sensor having a conventional can-sealed package structure. As a hermetically sealed structure for the semiconductor sensor, a so-called cap sealed package structure has been well known and comprises a mounting plate 3 called stem and a box-shaped cap 2 with a mounting flange welded on the stem 3, as shown in FIG. 7. Two holes 10 for mounting the semiconductor sensor 1 on a mounting plate (not shown) are provided at both round ends of the stem 3 and a plurality of electrical leads 4 protrude downwardly from the stem 3, passing therethrough.

As shown in FIG. 8 showing a plan view of the semiconductor sensor before welding of the cap 2, a semiconductor sensor element 5 is mounted on a hybrid IC circuit board 6 fixed on the stem 3 and each of terminals arranged along one side of an HIC circuit board 6 is electrically connected to a corresponding lead 4 by a bonding wire 7. An area of the stem 3 including HIC circuit board 6 and leads 4 is covered and sealed by the cap 2 when welded.

The structure for inserting and fixing the leads 4 to the stem 3 in a manner sealing the inside of the cap 2 shown in FIG. 7 is described next below.

FIG. 9 is an enlarged view of an area at which one terminal of the HIC circuit board 6 and one lead 4 are connected by means of the bonding wire 7 as shown in FIG. 8. The conductive leads 4 are inserted into the stem 3 before the HIC circuit board 6 is fastened to the stem 3. A glass tube is first fit onto each lead 4 to cover that part of the conductive lead 4 inserted to the stem 3, and the glass tube and conductive lead 4 subassembly is then inserted into a lead insertion hole of the stem 3. This subassembly is then heated to melt the glass tubes, thus forming a glass seal 8 around each lead 4 as shown in FIG. 9, securing and sealing each of the leads 4 in the lead insertion hole of the stem 3. The inside of the cap 2 is then sealed by welding the cap 2 to the stem 3.

With the semiconductor sensor 1 of a type shown in FIGS. 7 and 8, however, the semiconductor sensor 1 is secured to a mounting plate (not shown) with screws passing the mounting holes 10. In order to provide these mounting holes 10, the stem 3 has to have extended areas at both ends thereof in a length-wise direction of the stem and the size of the stem 3 necessarily increases to provide the mounting holes 10, thus increasing the size and overall cost of the semiconductor sensor unit.

The semiconductor sensor 1a shown in FIG. 10 was therefore developed to solve this problem. With this semiconductor sensor 1a, the conductive leads 4 are arranged in a balanced pattern conforming to the shape of the stem 3a, and the conductive leads 4 are soldered to the circuit board on which the semiconductor sensor 1 is mounted. FIG. 10 is a plan view of this semiconductor sensor 1a before the cap 2 is welded in place. Note, further, that like parts are identified by like reference numerals in FIGS. 8 and 10.

As shown in FIG. 10, the mounting holes 10 provided in the stem 3 shown in FIG. 8 are eliminated, the conductive leads 4 are arranged on the stem 3a equally spaced in two rows on opposite sides of the HIC circuit board 6a, and the conductive leads 4 are soldered to a mounting board to which the semiconductor sensor 1a is mounted to secure the semiconductor sensor 1a in place.

In the semiconductor sensor 1a shown in FIG. 10, however, when the semiconductor sensor 1a is soldered to the circuit board and when vibration or impact is applied to the solder joint after securing the semiconductor sensor 1a to the mounting board, the solder joints of the conductive leads 4 and the glass seal 8 are stressed, leading to degraded reliability in each member. Furthermore, though the semiconductor sensor having the structure shown in FIG. 10 makes it possible to eliminate mounting holes, it necessitates an increase in the width of a stem, and, therefore, it is impossible to decrease the area of the stem.

SUMMARY OF THE INVENTION

Therefore, an object of the present invention is to provide a semiconductor sensor with a can-sealed package structure whereby the overall size and cost can be reduced without degrading the reliability of the solder joints of the leads or the can-seal package.

To achieve the aforementioned object, a semiconductor sensor with a can-sealed package according to the present invention has at least one rod member for securing the package on the back of the stem of the package parallel to the conductor leads.

The rod member according to the present invention may be fixed to the back of the stem by brazing.

The rod member can be utilized as a ground lead by making it electrically conductive and using an electrically conductive brazing material.

Further, the rod member may be threaded or screwed to secure the package.

In another facet, the rod member may have a head portion for fixing it to the back of the stem easily.

It is also desirable to make a concarity on the back of the stem for accepting and fixing the head portion of the rod member.

With a semiconductor sensor according to the present invention, the rod member is secured to the back of the stem, i.e., the side opposite that on which the sensor and peripheral circuitry are located, and the semiconductor sensor can be secured by soldering the rod member to a circuit board to which the semiconductor sensor is mounted, because at least one rod member for fastening the package is secured separately from and in parallel to the conductor leads on the back of the stem of the package.

With a semiconductor sensor in which the rod member can be fixed to the back of the stem by brazing, the semiconductor sensor can be secured by soldering the rod member to the circuit board to which the semiconductor sensor is mounted.

With a semiconductor sensor according to the present invention, the conductive lead otherwise used as a ground terminal can be eliminated because a conductive member is used for the rod member and for the brazing material used to braze the rod member, and the rod member can therefore be used as the ground terminal.

With a semiconductor sensor according to one facet of the present invention, the rod member forms a column having a circular cross-section which is threaded. As a result, the semiconductor sensor can be secured by fastening the rod member to a unit.

With a semiconductor sensor according to another facet of the present invention, the fastener lead is a metal member comprising a flat head and a column-shaped member extending from the head, and the head is fastened to the back of the stem. As a result, the fixing strength of the rod member can be increased, and the semiconductor sensor can be fastened to the circuit board at a predetermined height above the circuit board by soldering or fastening the rod member to the circuit board.

BRIEF DESCRIPTION OF THE DRAWINGS

The present invention will become more fully understood from the detailed description given below and the accompanying diagrams wherein.

DESCRIPTION OF PREFERRED EMBODIMENTS

The preferred embodiments of a semiconductor sensor according to the present invention are described below with reference to the accompanying figures.

[Embodiment 1]

Figure 1:
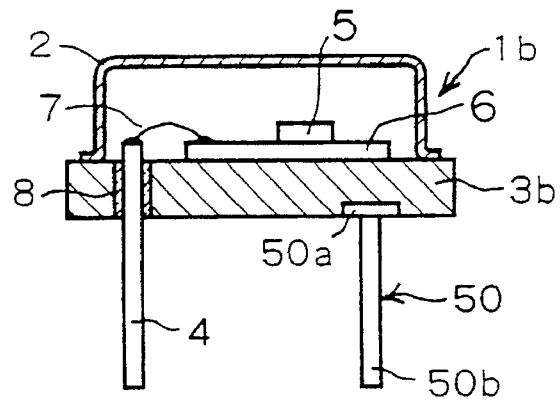
FIG. 1 is a cross section of a semiconductor sensor according to the first embodiment of the present invention.
Figure 2:
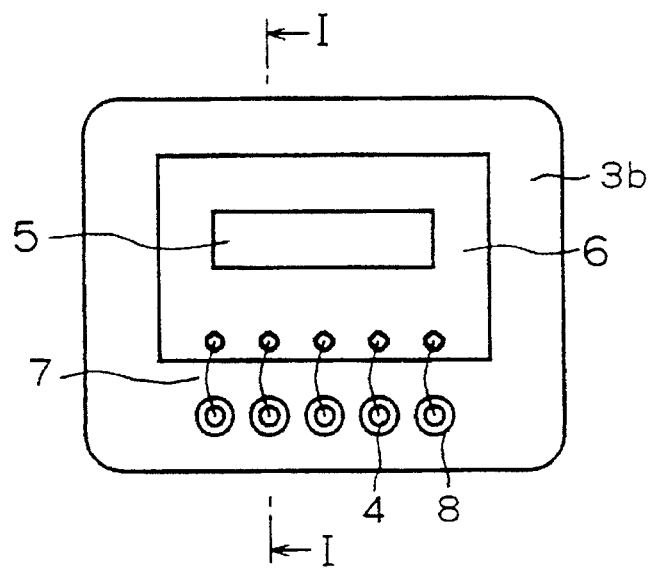
FIG. 2 is a plan view of the stem before the cap of the semiconductor sensor shown in FIG. 1 is welded to the stem.

FIG. 1 is a cross section of a semiconductor sensor according to a first embodiment of the present invention, and FIG. 2 is a plan view of the stem before the cap of the semiconductor sensor shown in FIG. 1 is welded to the stem. Note that like parts in FIGS. 1 and 2, and FIGS. 7 and 8 are identified by like reference numerals, and further description thereof is omitted below.

As shown in FIG. 1, the securing lead 50, as the rod member of the present invention, is a metal member comprising a flat head 50a and a cylindrical or columnar shaft 50b having a smaller diameter than the head 50a and extending from one side of the head 50a. A recess is provided in the back, i.e., the side opposite that to which the HIC circuit board 6 is affixed, of the plate-like stem 3b at the position to which the fastener lead 50 is there attached. The purpose of this recess is to prevent the head 50a of the fastener lead 50 from protruding beyond the plane of the stem 3b when the fastener lead head 50a is brazed to the stem 3b so that the shaft 50b is parallel to the conductive leads 4. The bottom of the recess is also flat, thus facilitating brazing the head 50a of the fastener lead 50.

In this first embodiment, the recess in stem 3b is formed such that when the head 50a of the fastener lead 50 is brazed, the face of the head 50a from which the shaft 50b extends is flush with the face of the stem 3b. Note, also, that the fastener lead 50 is fixed to the stem 3b parallel to the conductive leads 4. Furthermore, while only one fastener lead 50 is shown and described in this first embodiment for simplicity, the invention shall not be so limited and there may be one or more fastener leads 50.

The bonding strength of the fastener lead 50 to the stem 3b is also increased by means of this embodiment because a head 50a is provided on the fastener lead 50 to increase the area brazed to the stem 3b. Furthermore, a recess is provided for fastening the fastener lead 50 to the stem 3b, and the head 50a is brazed in to this recess. The head 50a therefore does not protrude from the surface of the stem 3b. It is therefore also possible to affix the semiconductor sensor 1b flush to the circuit board by soldering the shaft 50b of the fastener lead 50.

Figure 8:
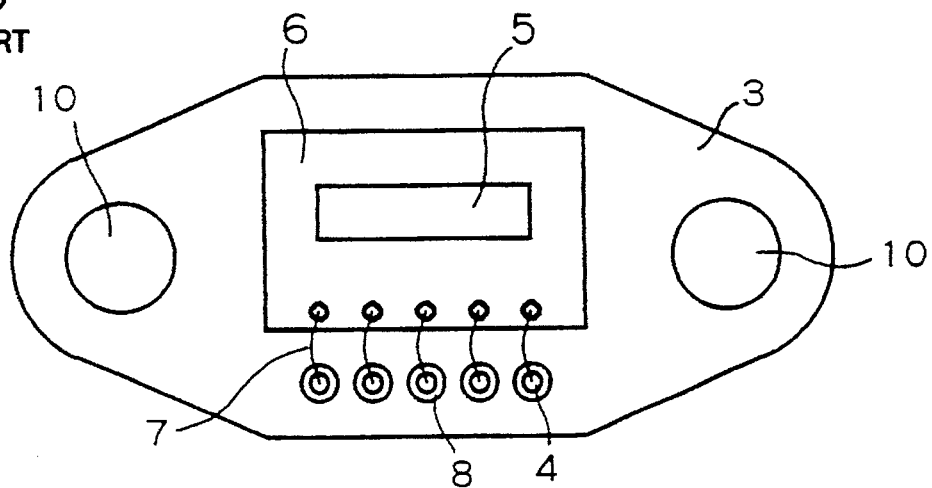
FIG. 8 is a plan view of the stem before the semiconductor sensor cap shown in FIG. 7 is welded to the stem.
Figure 9:
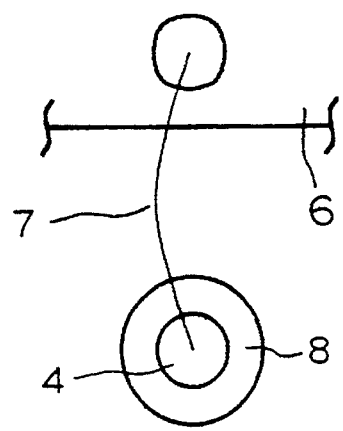
FIG. 9 is an enlarged view of the area in which the HIC circuit board 6 and conductive leads 4 are connected by means of the bonding wire 7 as shown in FIG. 8.
Figure 10:
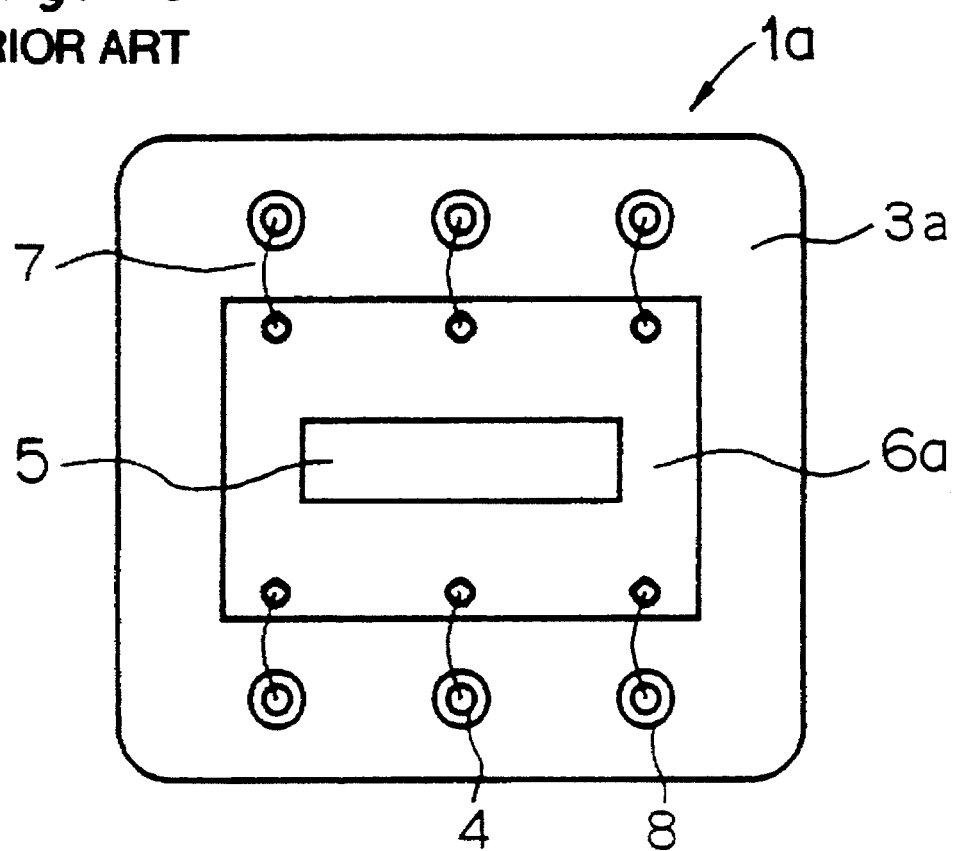
FIG. 10 is a plan view of a semiconductor sensor according to the prior art before the cap is welded in place.

Therefore, as shown in FIG. 2, it is not necessary to provide mounting holes 10 as are required by the prior art structure shown in FIG. 8, it is also not necessary to provide two rows of conductive leads 4 as shown in FIG. 10, and the total area of the stem 3b can therefore be reduced. In addition, it is not necessary to provide another process for brazing the fastener lead 50 because the fastener lead 50 can be brazed during the heating process for forming the glass seal 8. The area and the cost of a semiconductor sensor 1b according to this first embodiment of the present invention can therefore both be reduced.

[Embodiment 2]

Figure 3:
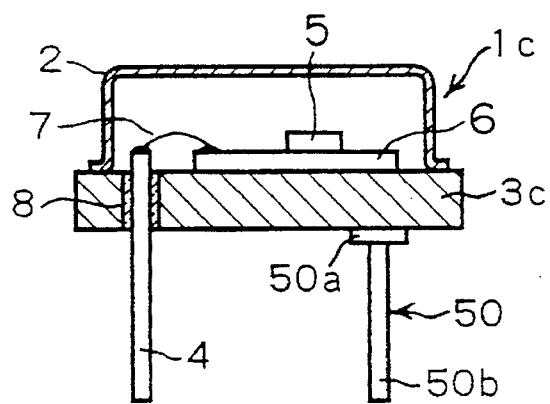
FIG. 3 is a cross section of a semiconductor sensor according to a second embodiment of the present invention.

FIG. 3 is a cross section of a semiconductor sensor 1c according to a second embodiment of the present invention. Note that like parts in FIG. 3, FIG. 1 of the first embodiment, and FIGS. 7 and 8 of the prior art are identified by like reference numerals, and further description thereof is omitted below. Only the differences between this embodiment and the first embodiment in FIG. 1 are described below.

This embodiment differs from that shown in FIG. 1 in that a recess is not provided in the stem. The stem of this second embodiment is therefore identified as 3c, and the semiconductor sensor as 1c.

Referring to FIG. 3, the head 50a is brazed to the back of the stem 3c, i.e., the side opposite that to which the HIC circuit board 6 is affixed, so that the shaft 50b of the fastener lead 50 is parallel to the conductive leads 4. As in the first embodiment above, only one fastener lead 50 is shown and described in this embodiment for simplicity, but the invention shall not be so limited and there may be one or more fastener leads 50.

The bonding strength of the fastener lead 50 to the stem 3c is also increased by means of this embodiment because a head 50a is provided on the fastener lead 50 to increase the area brazed to the stem 3c. The head 50a also protrudes from the surface of the stem 3c because the head 50a is brazed to the surface of the stem 3c on which the semiconductor sensor 1c is mounted. It is therefore also possible to affix the semiconductor sensor 1c in a position raised above the surface of the circuit board to which it is mounted by soldering the shaft 50b of the fastener lead 50, and the semiconductor sensor 1c can therefore be provided at a predetermined height above the circuit board.

Thus, as in the first embodiment above and shown in FIG. 2, it is not necessary to provide mounting holes 10 as are required by the prior art shown in FIG. 8, it is also not necessary to provide two rows of conductive leads 4 as shown in FIG. 10, and the total area of the stem 3b can therefore be reduced. In addition, it is not necessary to provide another process for brazing the fastener lead 50 because the fastener lead 50 can be brazed during the heating process for forming the glass seal 8. The area and the cost of a semiconductor sensor 1c according to this second embodiment of the present invention can therefore both be reduced.

[Embodiment 3]

Figure 4:
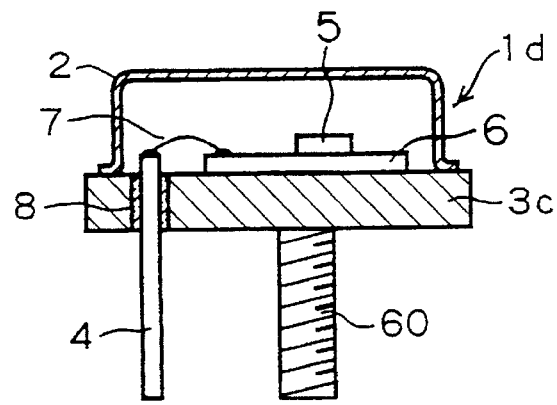
FIG. 4 is a cross section of a semiconductor sensor according to a third embodiment of the present invention.

FIG. 4 is a cross section of a semiconductor sensor 1d according to a third embodiment of the present invention. Note that like parts in FIG. 4, FIG. 1 and FIG. 3 of the first and second embodiments, and FIGS. 7 and 8 of the prior art are identified by like reference numerals, and further description thereof is omitted below. Only the differences between this embodiment and the second embodiment in FIG. 3 are described below.

This embodiment differs from that shown in FIG. 3 in that the constitution and disposition of the fastener lead is changed. The fastener lead of this third embodiment is therefore identified as 60, and the semiconductor sensor as 1d.

As shown in FIG. 4, the fastener lead 60 has a relatively large diameter shaft, the sides of which are threaded. The fastener lead 60 is directly brazed to the back of the plate-like stem 3c, i.e., the side opposite that to which the HIC circuit board 6 is affixed, so that the fastener lead 60 is parallel to the conductive leads 4. As in the first and third embodiments above, only one fastener lead 60 is shown and described in this embodiment for simplicity, but the invention shall not be so limited and there may be one or more fastener leads 60.

By means of the third embodiment thus described, the semiconductor sensor 1d can be fastened to the unit of which the semiconductor sensor 1d is part using a threaded nut because the threaded fastener lead 60 is brazed to the surface of the stem 3c to which the semiconductor sensor 1d is sealed.

It is therefore possible to improve the mounting reliability of the semiconductor sensor according to this third embodiment relative to methods of affixing the semiconductor sensor by soldering the fastener lead. In addition, as in the embodiment described above and shown in FIG. 2, it is not necessary to provide mounting holes 10 as are required by the prior art shown in FIG. 8, it is also not necessary to provide two rows of conductive leads 4 as shown in FIG. 10, and the total area of the stem 3b can therefore be reduced. In addition, it is not necessary to provide another process for brazing the fastener lead 60 because the fastener lead 60 can be brazed during the heating process for forming the glass seal 8. The area and the cost of a semiconductor sensor 1d according to this third embodiment of the present invention can therefore both be reduced.

[Embodiment 4]

Figure 5:
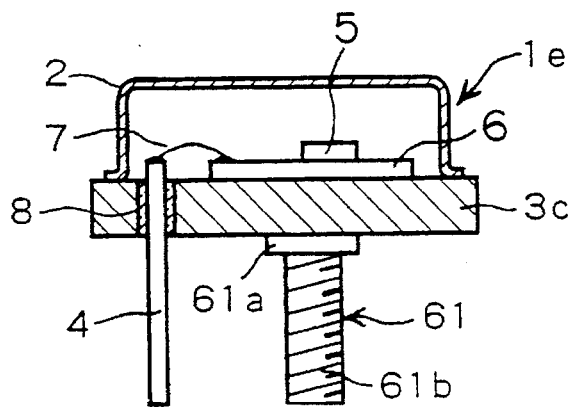
FIG. 5 is a cross section of a semiconductor sensor according to a fourth embodiment of the present invention.

FIG. 5 is a cross section of a semiconductor sensor 1e according to a fourth embodiment of the present invention. Note that like parts in FIG. 5, FIG. 1, FIG. 3, and FIG. 4 of the first, second, and third embodiments, and FIGS. 7 and 8 of the prior art are identified by like reference numerals, and further description thereof is omitted below. Only the differences between this embodiment and the third embodiment in FIG. 4 are described below.

This embodiment differs from that shown in FIG. 4 in that a flat head 61a is disposed on the fastener lead. The fastener lead of this third embodiment is therefore identified as 61, and the semiconductor sensor as 1e.

As shown in FIG. 5, the fastener lead 61 is a metal member comprising a flat head 61a and a cylindrical or columnar shaft 61b having a smaller cross sectional area than the head 61a and extending from one side of the head 61a. The head 61a is brazed to the back of the stem 3c, i.e., the side opposite that to which the HIC circuit board 6 is affixed, so that the shaft 61b of the fastener lead 61 is parallel to the conductive leads 4. As in the embodiments described above, only one fastener lead 61 is shown and described in this embodiment for simplicity, but the invention shall not be so limited and there may be one or more fastener leads 61.

The bonding strength of the fastener lead 61 to the stem 3c is also increased in this embodiment because a head 61a is provided on the fastener lead 61 to increase the area brazed to the stem 3c. The head 61a also protrudes from the surface of the stem 3c because the head 61a is brazed to the surface of the stem 3c on which the semiconductor sensor 1c is mounted. It is therefore also possible to affix the semiconductor sensor 1c in a position raised a predetermined height above the surface of the unit of which the semiconductor sensor is part by threading a nut on the threaded shaft 61b of the fastener lead 61. The effects of stress occurring when the semiconductor sensor 1e is fastened to the unit of which it is part can also be alleviated.

As in the embodiments described above and shown in FIG. 2, it is therefore not necessary to provide mounting holes 10 as are required by the prior art shown in FIG. 8, it is also not necessary to provide two rows of conductive leads 4 as shown in FIG. 10, and the total area of the stem 3b can therefore be reduced. In addition, it is not necessary to provide another process for brazing the fastener lead 61 because the fastener lead 61 can be brazed during the heating process for forming the glass seal 8. The area and the cost of a semiconductor sensor 1e according to this fourth embodiment of the present invention can therefore both be reduced.

[Embodiment 5]

Figure 6:
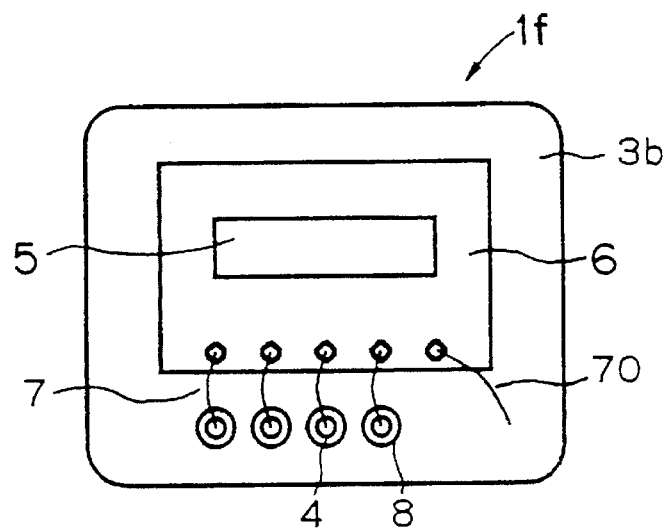
FIG. 6 is a plan view of the stem before the cap of the semiconductor sensor according to a fifth embodiment of the present invention is welded to the stem.
Figure 7:
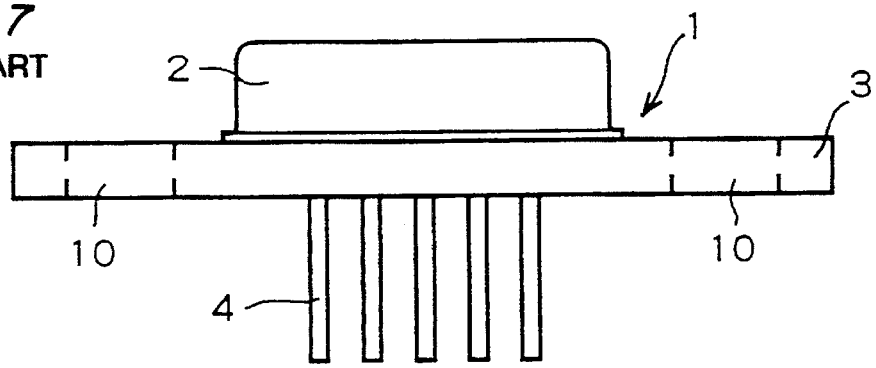
FIG. 7 is a front view of a semiconductor sensor using a can-seal package according to the prior art.

FIG. 6 is a plan view of the stem before the cap of the semiconductor sensor if according to a fifth embodiment of the present invention is welded to the stem. Note that like parts in FIG. 6 and FIG. 2 are identified by like reference numerals, and further description thereof is omitted below. Only the differences between the fifth embodiment shown in FIG. 6 and the preceding embodiment shown in FIG. 2 are described below.

This embodiment differs from that shown in FIG. 2 in that the ground terminal of the HIC circuit board 6 shown in FIG. 2 and the stem 3b are bonded using a bonding wire 70. The semiconductor sensor of this fifth embodiment is therefore identified as 1f below.

Referring to FIG. 6, the ground terminal of the HIC circuit board 6 and the stem 3b are electrically connected by bonding with a bonding wire 70, and a conductive material is used for the stem 3b, the fastener lead 50, and the brazing material used to braze the fastener lead 50. As a result, the fastener lead 50 can be used as the ground terminal of the semiconductor sensor 1f. It is to be noted that this fifth embodiment has been described using the semiconductor sensor 1b of the first embodiment by way of example only, and can use the semiconductor sensors of the second, third, or fourth embodiments.

The fastener lead 50 can thus be used as the ground terminal of the semiconductor sensor 1f in the fifth embodiment of the present invention because a conductive material is used for the stem 3b, the fastener lead 50, and the brazing material, and the stem 3b and ground terminal of the HIC circuit board 6 are bonded by means of a bonding wire 70. It is therefore possible to eliminate the conductive lead 4 otherwise used as the ground terminal, and the area of the stem 3b can be further reduced. As a result, the area and the cost of a semiconductor sensor 1e according to this embodiment of the present invention can therefore both be reduced.

It is to be noted that the columnar shaft 50b of the fastener lead 50 in the first and second embodiments above shall not be limited to a round member, and may alternatively be a shaft having a polygonal cross section.

As will be known from the preceding descriptions of the preferred embodiments of the present invention, the fastener lead can be fastened to the back of the stem, i.e., the side opposite that on which the sensor and peripheral circuitry are located, and the semiconductor sensor can be secured by soldering the fastener lead to the circuit board to which the semiconductor sensor is mounted, because at least one fastener lead for fastening the package is secured separately and parallel to the conductor leads on the back of the stem of the package. It is therefore not necessary to provide mounting holes for the semiconductor sensor in the stem, and it is not necessary to provide plural balanced rows of conductive leads. The force acting on the glass seal member of the conductive leads can therefore be reduced, the stem area can be reduced, and the overall size and cost of the semiconductor sensor can therefore be reduced.

Furthermore, because the fastener lead is affixed to the stem by brazing, the fastener lead can be brazed during the heating process used for forming the glass seal for the conductive leads. It is therefore not necessary to provide another process for brazing the fastener lead, and increased manufacturing costs are not incurred. As a result, a semiconductor sensor of reduced size and cost can be provided.

The fastener lead can also be used as the ground terminal of the semiconductor sensor by using a conductive material for the stem the, fastener lead, and the brazing material used to braze the fastener lead. The conductive lead otherwise used as the ground terminal is therefore not required and can be eliminated, and the size and cost of a semiconductor sensor according to the present invention can therefore both be reduced.

The fastener lead can also be easily soldered to the circuit board to which the semiconductor sensor is mounted because the fastener lead is a columnar metal member. The reliability of the semiconductor sensor mounting can therefore be improved.

It is also possible to fasten the semiconductor sensor to the unit of which it is part by means of a threaded nut if the fastener lead is a cylindrical member having threaded sides. The reliability of the semiconductor sensor mounting can therefore be improved even relative to semiconductor sensors secured by soldering the fastener lead.

By providing a flat head on the fastener lead and fastening the head to the stem, the fastening area can be increased. The bonding strength of the fastener lead can therefore be increased, and the semiconductor sensor can be fastened at a predetermined height above the mounting surface as required.

It is also possible to fasten the semiconductor sensor at a predetermined height above the mounting surface of the unit of which it is part by means of a threaded nut if the shaft extending from the head of the fastener lead is a cylindrical member having threaded sides. The effects of stress on the semiconductor sensor when the semiconductor sensor is fastened by turning a threaded nut on the threaded shaft can also be alleviated, and the reliability of the mounting can be improved.

The fastening area can also be increased, the fastening strength of the fastener lead can be improved, and the semiconductor sensor can be fastened flush to the stem without the head of the fastener lead protruding from the stem by providing a recess in the stem at the position where the fastener lead is secured, and inserting the head of the fastener lead into this recess when affixing the fastener lead to the stem.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor sensor with a sealed cap package comprising:

semiconductor sensor means for transducing a physical quantity into an electrical signal;

an electrically conducting stem having a front surface on which said semiconductor sensor means is mounted, a back surface opposite the front surface, and a plurality of through holes in a thickness direction of said stem transverse to the front and back surfaces;

a plurality of electrically conductive leads for extracting the electrical signal of said semiconductor sensor means, each conductive lead being inserted into one of the through holes and secured to said stem by a seal member, sealing a gap between said lead and said stem;

a cap mounted on said stem, covering and sealing said semiconductor sensor means and the plurality of through holes; and at least one electrically conducting rod member brazed with an electrically conducting brazing material directly to and electrically connected to the back surface of said stem, spaced from the through holes, and parallel to said conductive leads, for securing said semiconductor sensor on a mount member.

2. The semiconductor sensor according to claim 1 wherein said rod member is a column-shaped metal member.

3. The semiconductor sensor according to claim 2 wherein said rod member is a threaded cylinder.

4. A semiconductor sensor comprising:

semiconductor sensor means for transducing a physical quantity into an electrical signal;

a stem having a front surface on which said semiconductor sensor means is mounted, a back surface opposite the front surface, and a plurality of through holes in a thickness direction of said stem transverse to the front and back surfaces;

a plurality of electrically conductive leads for extracting the electrical signal of said semiconductor sensor means, each conductive lead being inserted into one of the through holes and secured to said stem by a seal member, sealing a gap between said lead and said stem;

a cap mounted on said stem, covering and sealing said semiconductor sensor means and the plurality of through holes; and at least one rod member secured to the back surface of said stem, spaced from the through holes, and parallel to said conductive leads, for securing said semiconductor sensor on a mount member wherein said rod member is a metal member comprising a flat head and a column-shaped member extending from said head and said head is fastened to the back surface of said stem.

5. The semiconductor sensor according to claim 4 wherein the column-shaped member is threaded.

6. The semiconductor sensor according to claim 4 wherein said stem includes a recess where said rod member is secured to said stem, and the head of said rod member is disposed in the recess.

* * * * *